(12) United States Patent
Silva et al.

(10) Patent No.: US 7,196,589 B1
(45) Date of Patent: Mar. 27, 2007

(54) APPARATUS AND METHOD FOR DUAL FEATURES OF FREQUENCY SETTING AND FREQUENCY SYNCHRONIZATION IN ONE PIN

(75) Inventors: Faruk Jose Nome Silva, Sunnyvale, CA (US); Kwok-Fu Chiu, San Jose, CA (US)

(73) Assignee: National Semiconductor Corporation, Santa Clara, CA (US)

(*) Notice: Subject to any disclaimer, the term of this patent is extended or adjusted under 35 U.S.C. 154(b) by 362 days.

(21) Appl. No.: 10/971,502

(22) Filed: Oct. 21, 2004

(51) Int. Cl.
*H03B 5/24* (2006.01)
*H03K 3/02* (2006.01)

(52) U.S. Cl. .................. 331/49; 331/143; 331/153; 331/173

(58) Field of Classification Search .............. 331/49, 331/111, 143, 153, 173
See application file for complete search history.

(56) References Cited

U.S. PATENT DOCUMENTS

| | | | | | |
|---|---|---|---|---|---|
| 5,093,633 | A | * | 3/1992 | Benhamida | 331/59 |
| 5,369,377 | A | * | 11/1994 | Benhamida | 331/49 |
| 5,416,445 | A | * | 5/1995 | Narahara | 331/49 |
| 5,900,787 | A | * | 5/1999 | Yoshimura | 331/116 FE |
| 6,157,265 | A | * | 12/2000 | Hanjani | 331/49 |
| 6,581,158 | B1 | * | 6/2003 | Plourde | 713/1 |
| 6,782,485 | B2 | * | 8/2004 | Takai | 713/500 |

OTHER PUBLICATIONS

Linear Technology, "Dual High Efficiency, Low Noise, Synchronous Step-Down Switching Regulators", LTC1538-AUX/LTC1539, pp. 1-32.

Linear Technology, "High Efficiency, 2-Phase Synchronous Step-Down Switching Regulator", LTC1628-SYNC, pp. 1-32.

Maxim Integrated Products, "2.35V to 5.5V, 0.5% Accurate, 1MHz PWM Step-Down Controllers with Voltage Margining", Rev. Jan. 2003, pp. 1-29.

A. Okuno et al., "Phase-Lock Loop Operated Load-Resonance Inverter Using Static Induction Power Transistors and its Practical Charateristic Evaluations", pp. 1-7.

Sandeep Dhar and Dragan Maksimovic, "Switching Regulator With Dynamically Adjustable Supply Voltage for Low Power VLSI", The 27th Annual Conference of the IEEE Industrial Electronics Society 2001, pp. 1874-1879.

Hisoshi Sadamura et al., "Spread-Spectrum Clocking in Switching Regulators to Reduce EMI", IEEE, 2002, pp. 141-144.

* cited by examiner

*Primary Examiner*—David Mis
(74) *Attorney, Agent, or Firm*—Darby & Darby PC; Matthew M. Gaffney

(57) ABSTRACT

An integrated circuit includes an oscillator circuit, where a frequency of an oscillator output signal provided by the oscillator circuit is adjustable by either coupling a resistor to an input pin, or by applying an external clock signal to the input pin. The oscillator circuit includes a comparator, a follower, a current-controlled oscillator, and a switch circuit. The switch circuit is coupled between the input pin and a node that is coupled to the current-controlled oscillator. Also, the follower is arranged to cause the voltage at the node to be at a pre-defined voltage unless the voltage at the node is overdriven by an external clock signal. The comparator circuit is arranged to determine whether the signal at the input pin is a clock signal. If it is determined that the signal at the input pin is a clock signal, the switch circuit is opened.

20 Claims, 4 Drawing Sheets

APPARATUS AND METHOD FOR DUAL FEATURES OF FREQUENCY SETTING AND FREQUENCY SYNCHRONIZATION IN ONE PIN

FIELD OF THE INVENTION

The invention is related to electronic circuits, and in particular, but not exclusively, to an integrated circuit that may be employed to create a signal having a frequency that is based either an external resistor or an external clock signal at a single pin.

BACKGROUND OF THE INVENTION

A switch controller may employ an internal clock. Typically, the frequency of the internal clock may be based on either external components coupled to a pin, or based on an external clock applied to a separate pin. In other switch controllers, the internal clock has a fixed frequency, unadjustable by external components.

BRIEF DESCRIPTION OF THE DRAWINGS

Non-limiting and non-exhaustive embodiments of the present invention are described with reference to the following drawings, in which.

DETAILED DESCRIPTION

Figure 1:
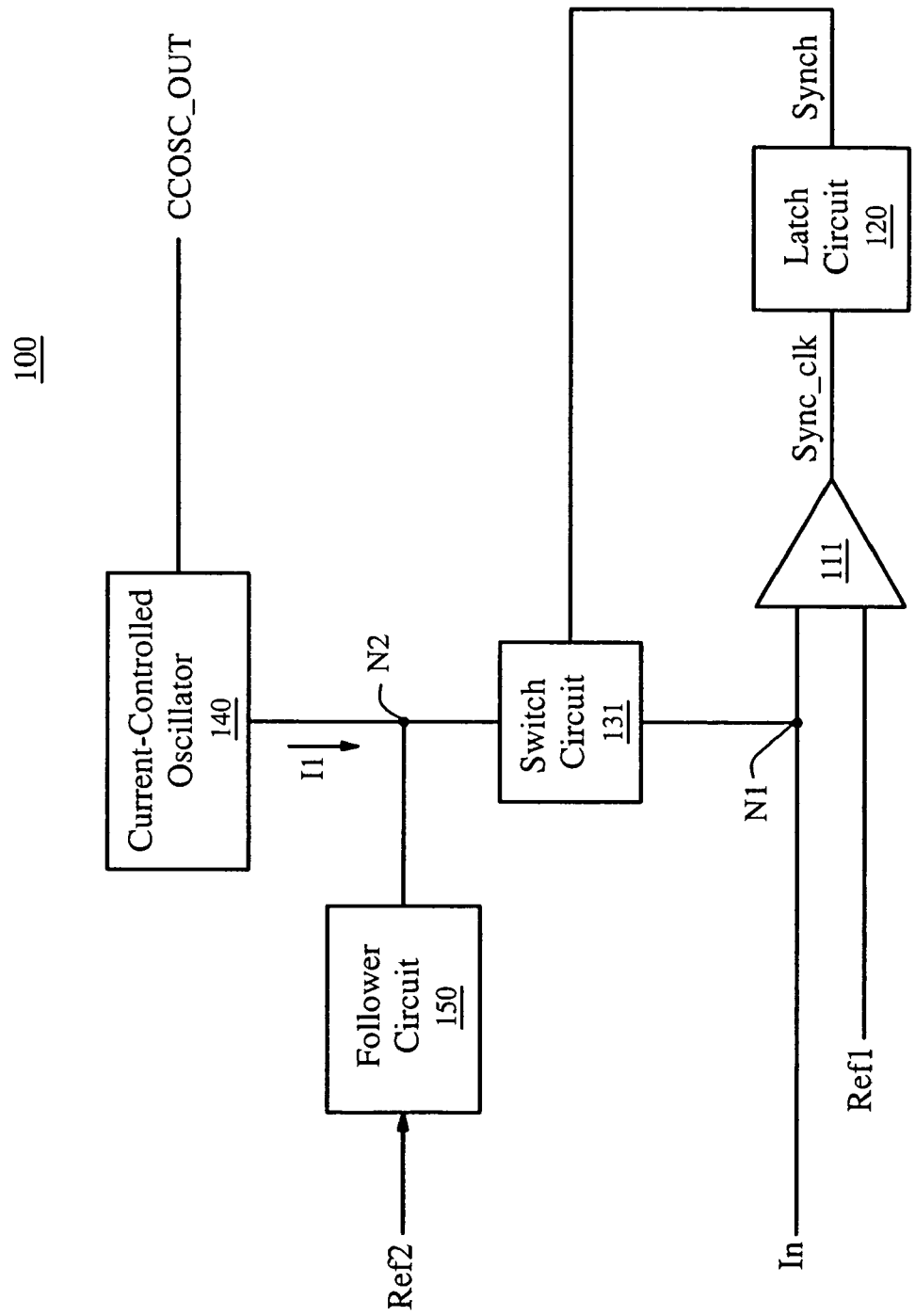
FIG. 1 shows a block diagram of an embodiment of an oscillator circuit.

Various embodiments of the present invention will be described in detail with reference to the drawings, where like reference numerals represent like parts and assemblies throughout the several views. Reference to various embodiments does not limit the scope of the invention, which is limited only by the scope of the claims attached hereto. Additionally, any examples set forth in this specification are not intended to be limiting and merely set forth some of the many possible embodiments for the claimed invention.

Throughout the specification and claims, the following terms take at least the meanings explicitly associated herein, unless the context dictates otherwise. The meanings identified below do not limit the terms, but merely provide illustrative examples for the terms. The meaning of "in" includes "in" and "on." The phrase "in one embodiment," as used herein does not necessarily refer to the same embodiment, although it may. The term "coupled" means at least either a direct electrical connection between the items connected, or an indirect connection through one or more passive or active intermediary devices. The term "circuit" means at least either a single component or a multiplicity of components, either active and/or passive, that are coupled together to provide a desired function. The term "signal" means at least one current, voltage, charge, temperature, data, or other signal.

Briefly stated, the invention is related to an integrated circuit that includes an oscillator circuit. A frequency of an oscillator output signal provided by the oscillator circuit is adjustable by either coupling a resistor to an input pin, or by applying an external clock signal to the input pin. The oscillator circuit includes a comparator, a voltage follower, a current-controlled oscillator, and a switch circuit. The switch circuit is coupled between the input pin and a node that is coupled to the current-controlled oscillator. Also, the follower is arranged to cause the voltage at the node to be at a pre-defined voltage unless the voltage at the node is overdriven by an external clock signal. The comparator circuit is arranged to determine whether the signal at the input pin is a clock signal. If it is determined that the signal at the input pin is a clock signal, the switch circuit is opened.

FIG. 1 shows a block diagram of an embodiment of oscillator circuit 100. Oscillator circuit 100 includes comparator circuit 111, latch circuit 120, switch circuit 131, current-controlled oscillator 140, and voltage follower circuit 150.

In operation, in one embodiment, switch circuit 131 is closed at power-up. Voltage follower circuit 150 may be arranged to cause the voltage at node N2 to follow voltage ref2. In one embodiment, voltage ref2 is substantially the bandgap voltage of silicon, roughly 1.25V.

An external resistor Rext may be coupled between node N1 and ground (not shown). In this case, current-controlled oscillator 140 receives current I1 such that current I1 is substantially given by ref2/Rext. In one embodiment, current-controlled oscillator 140 is arranged to provide current-controlled oscillator output signal CCOSC_OUT such that signal CCOSC_OUT has a frequency that is based on current I1. Signal CCOSC_OUT may be a clock signal, a sawtooth ramp signal, or the like.

Accordingly, if external resistor Rext is coupled to node N1, signal CCOSC_OUT has a frequency that is based on the resistance of resistor Rext. Alternatively, if an external clock signal is applied at node N1, the frequency of signal sync_clk is substantially equal to the frequency of the external clock signal.

Comparator circuit 111 may be arranged to detect whether signal In is a clock signal. If a clock with sufficient drive to overdrive the voltage provided by follower circuit 150 is applied at node N2, when the voltage at node N1 exceeds reference voltage ref1, comparator circuit 111 asserts signal sync_clk. Reference voltage ref1 is greater than reference voltage ref2. In one embodiment, voltage ref1 is 1.5V.

Latch circuit 120 may be arranged to provide assert signal synch if synchronization clock signal sync_clk is asserted. Also, latch circuit 120 may be configured to de-assert signal sync_clk if a reset condition occurs. In one embodiment, the reset condition is an assertion of a power-on reset signal (not shown in FIG. 1).

Further, in one embodiment, switch circuit 131 is configured to open if synchronization signal synch is asserted, and to be closed if signal synch is not asserted. Switch circuit 131 is arranged to couple nodes N1 and N2 together if switch circuit 131 is closed, and to substantially de-couple nodes N1 and N2 from each other if switch circuit 131 is open.

Figure 2:
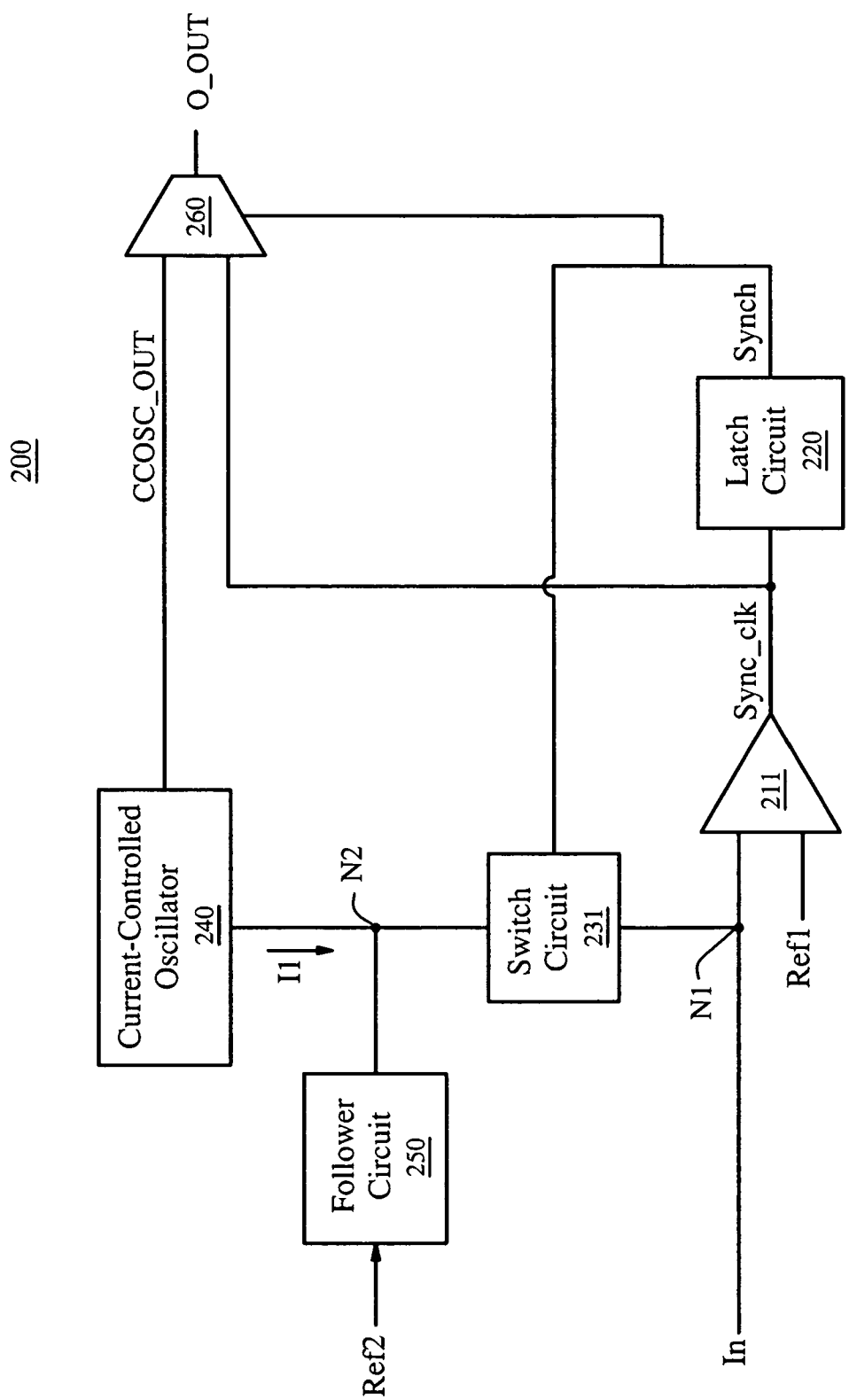
FIG. 2 illustrates a block diagram of an embodiment of the oscillator circuit of FIG. 1 that includes a multiplexer.

FIG. 2 illustrates a block diagram of an embodiment of oscillator circuit 200. Oscillator circuit 200 may be employed as an embodiment of oscillator circuit 100. Oscillator circuit 200 further includes multiplexer 260. Multiplexer 260 is arranged to provide multiplexer output signal O_OUT by multiplexing signals sync_clk and CCOSC_OUT based on signal synch. In one embodiment, signal CCOSC_OUT is a clock signal. In this embodiment, signal O_OUT is a clock signal having a frequency that is based on an external clock signal if the external clock signal is applied at node N1, and based on a resistance of an external resistor if the external resistor is coupled to node N1.

Figure 3:
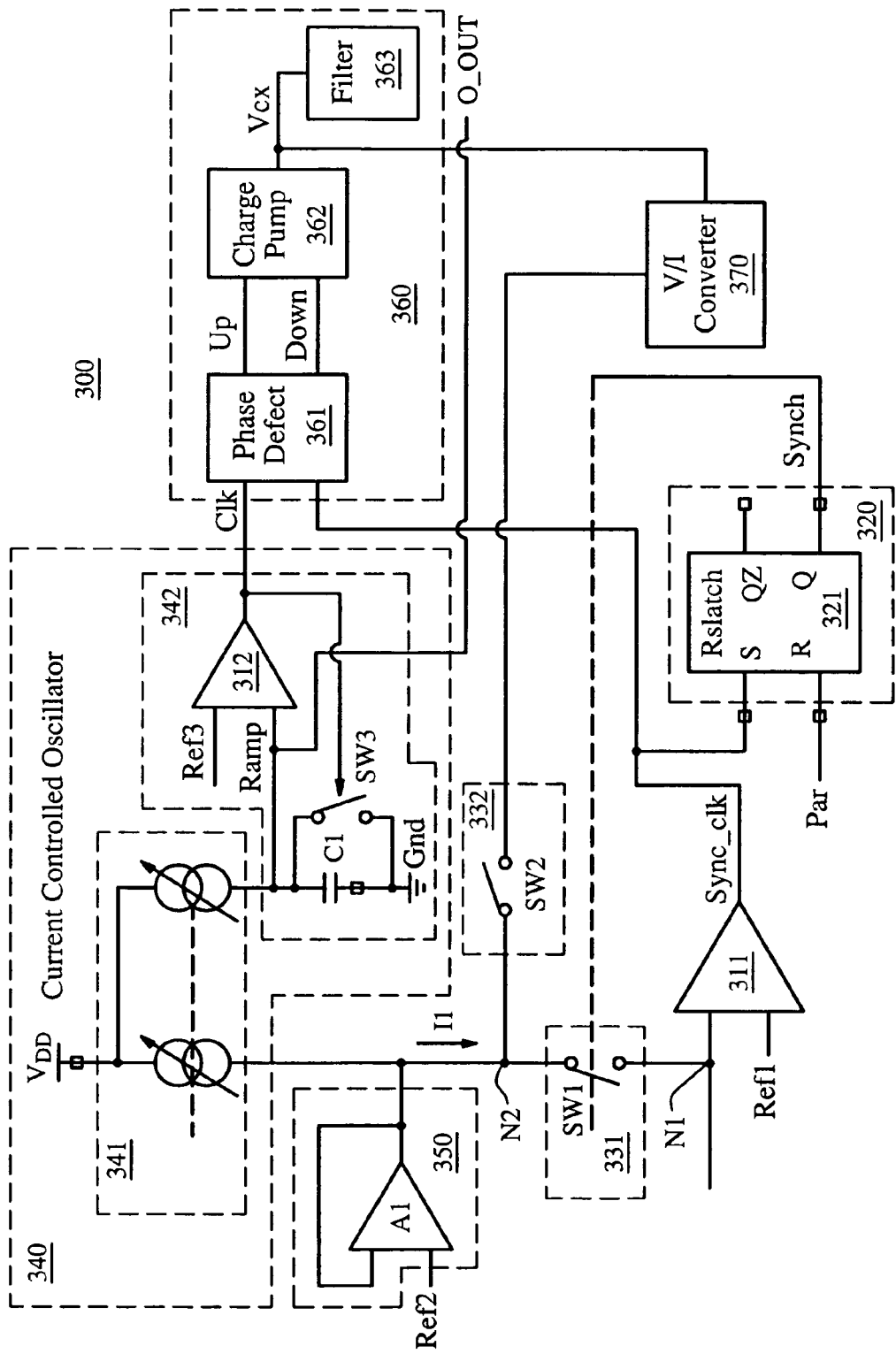
FIG. 3 shows a block diagram of an embodiment of the oscillator circuit of FIG. 1 that includes a phase-locked loop.

FIG. 3 shows a block diagram of an embodiment of oscillator circuit 300. Oscillator circuit 300 may be employed as an embodiment of oscillator circuit 100 of FIG. 1. Oscillator circuit 300 further includes switch circuit 332, voltage-to-current converter 370, and phase detection circuit 360. In one embodiment, phase detection circuit includes phase detector 361, charge pump 362, and filter 363. Follower circuit 350 includes operational amplifier A1. Also, switch circuit 331 includes switch SW1. Switch circuit 332 includes switch SW2. Latch circuit 320 includes RS latch 321. Current-controlled oscillator 340 includes current mirror 341 and current-controlled sawtooth ramp generator circuit 342. An embodiment of current-controlled sawtooth ramp generator circuit 342 includes capacitor C1, switch SW3, and comparator circuit 342.

RS latch 321 includes a set input that is coupled to the output of comparator circuit 311, a reset input that is arranged to receive power-on reset signal por, and a Q output that is arranged to provide signal synch.

In operation, switch SW1 is open if signal synch is asserted, and closed if signal synch is not asserted. Conversely, switch SW2 is arranged to close if signal synch is asserted, and to be open if signal synch is not asserted.

Also, current mirror 341 is arranged to provide, to capacitor C1, a current that is based on current I1. Capacitor C1 is arranged to provide sawtooth ramp voltage Ramp based, in part, on the current provided by current mirror 341. Additionally, comparator circuit 312 is arranged to provide signal clk based on a comparison of voltage Ramp with reference voltage ref3. In one embodiment, voltage ref3 is 2V. Comparator circuit 312 is arranged to trip when voltage Ramp reaches voltage ref3, and to assert signal clk when tripped. In one embodiment, comparator circuit 312 is arranged to operate with hysteresis such that, if comparator circuit 312 trips, clk is not de-asserted until voltage Ramp reaches voltage ref3−1V. Switch SW3 is configured to close is signal clk is asserted, and to be open otherwise. Accordingly, switch SW3 is arranged to discharge capacitor C1 when signal clk is asserted.

Phase detection circuit 360 is arranged to provide voltage Vcx based on signal clk and signal Sync_clk. Also, voltage-to-current converter 370 is arranged to provide current I1 based on voltage Vcx if switch SW2 is closed.

In one embodiment, voltage Ramp is provided as oscillator output signal O_OUT, as shown in FIG. 3. In another embodiment, signal clk is provided as oscillator output signal O_OUT. In yet another embodiment, signal O_OUT may be a signal other than voltage Ramp or signal clk.

During operation, if external resistor Rext (not shown) is coupled to node N1, switch SW1 is closed and switch SW2 is open. Current I1 is based, in part, on the resistance of resistor Rext. Accordingly, signal O_OUT is based, in part, on the resistance of Rext.

Alternatively, if an external clock signal is applied at node N1, switch SW1 is opened and switch SW2 is closed. Oscillator circuit 360, V/I converter 370, and current-controlled oscillator 340 operate together as a phase-locked loop to provide signal O_OUT such that the frequency of signal O_OUT substantially matches the frequency of the external clock signal once the feedback loop reaches equilibrium.

Although one embodiment is illustrated and described in FIG. 3, many other embodiments are within the spirit and scope of the invention. For example, oscillator circuit 300 may include more or less components than are illustrated in FIG. 3. Also, throughout the specification and claims, the word "coupled" includes both a direct connection, and a connection through one or more passive or active intermediary components. For example, the Q output of RS latch 321 is coupled to the control input of switch circuit 331. In one embodiment, the Q output is directly connected to the control input of switch circuit 331. In another embodiment, a logic gate is coupled between the Q output of RS latch 321 and the control input of switch circuit 331. Similarly, switch circuit 331 is coupled to input node N1. In one embodiment, switch circuit 331 is directly connected to node N1. In another embodiment, a resistor is coupled between node N1 and switch circuit 331.

Figure 4:
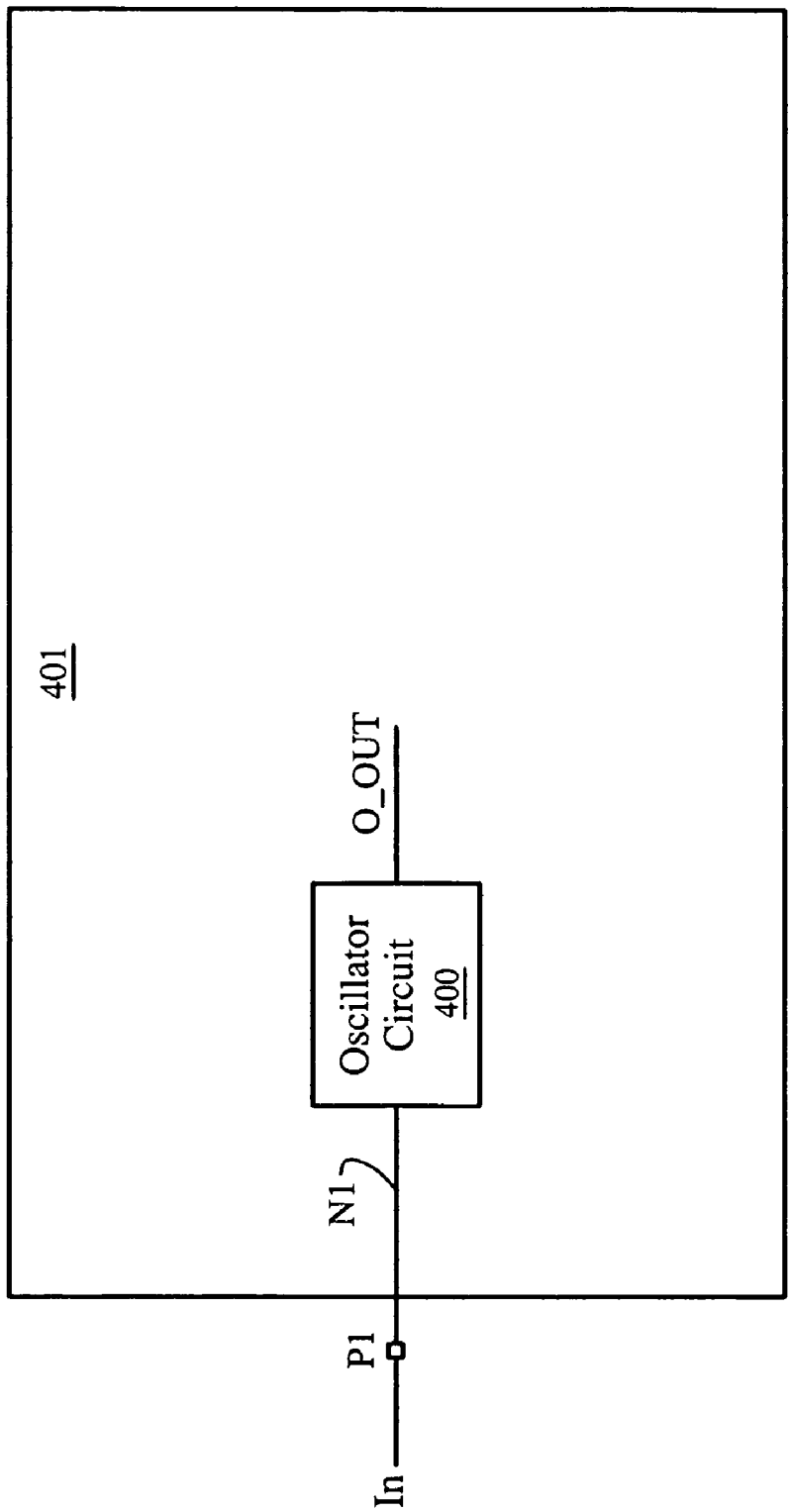
FIG. 4 illustrates an embodiment of an integrated circuit that includes an embodiment of the oscillator circuit of FIG. 1, arranged in accordance with aspects of the invention.

FIG. 4 illustrates an embodiment of integrated circuit 401. Integrated circuit 401 includes input pin P1 and oscillator circuit 400. Integrated circuit 401 may include many more components than are illustrated in FIG. 4.

Oscillator circuit 400 is arranged to provide oscillator output signal O_OUT. Oscillator circuit 400 is arranged such that, if an input clock signal with sufficient drive is provided at input pin P1, the frequency of signal O_OUT is based on the frequency of the input clock signal. Oscillator circuit 400 is further arranged such that, if a resistor is provided at input pin P1, the frequency of signal O_OUT is based on a resistance of the resistor. Oscillator circuit 100 of FIG. 1, oscillator circuit 200 of FIG. 2, oscillator circuit 300 of FIG. 3, or the like, may be employed as an embodiment of oscillator circuit 400 of FIG. 4. In one embodiment, signal O_OUT is a sawtooth ramp signal. In another embodiment, signal O_OUT is a clock signal.

In one embodiment (not shown), integrated circuit 401 further includes a pulse width modulation comparator that is arranged to compare signal O_OUT with a modulating signal, and oscillator circuit 400 is arranged to provide signal O_OUT signal such that signal O_OUT is a sawtooth ramp signal. In other embodiments, signal O_OUT may be employed for other applications.

The above specification, examples and data provide a description of the manufacture and use of the composition of the invention. Since many embodiments of the invention can be made without departing from the spirit and scope of the invention, the invention also resides in the claims hereinafter appended.

What is claimed is:

1. A circuit for frequency setting and synchronization, comprising:
   a first comparator circuit including a first input, a second input that is coupled to an input node, and an output;
   a latch circuit including a first input that is coupled to the output of the comparator circuit, and an output;
   a switch circuit that is coupled between the input node and a current node, wherein the switch circuit includes a control input that is coupled to the output of the latch circuit; and
   a current-controlled oscillator that is coupled to the current node, and a first output.

2. The circuit of claim 1, further comprising a follower circuit that is coupled to the current node.

3. The circuit of claim 1, wherein the latch circuit includes an RS latch, the RS latch includes a set input, a reset input, and an output; the set input of the RS latch is coupled to the output of the comparator, the reset input of the latch circuit is arranged to receive a power-on-reset signal, and the output of the RS latch is coupled to the control input of the switch circuit.

4. The circuit of claim 1, further comprising:
a logic gate including a first input that is coupled the output of the latch circuit, and an output that is coupled to the control input of the switch circuit; and
a resistor that is coupled between the input node and the switch circuit.

5. The circuit of claim 1, wherein the first comparator circuit is arranged to compare a signal at the input node with a reference signal at the first input of the comparator circuit, and further arranged to provide a synchronization clock signal at the output of the comparator circuit in response to the comparison.

6. The circuit of claim 5, further comprising a follower circuit that coupled to the current node, wherein the follower circuit is arranged to receive another reference voltage that is less than the reference voltage; and wherein the follower circuit is further arranged to, unless the current node is overdriven by a clock signal, provide a follower output voltage at the current node that is substantially equal to the other reference voltage.

7. The circuit of claim 1, further comprising another switch circuit, wherein the other switch circuit is arranged such that the other switch circuit is open if the switch circuit is closed, and such that the other switch circuit is closed if the switch circuit is open.

8. The circuit of claim 7, further comprising:
a phase detection circuit that includes a first input that is coupled to the first output of the oscillator circuit, a second input that is coupled to the output of the first comparator circuit, and an output;
a voltage-to-current converter circuit that is coupled between the other switch circuit and the output of the phase detection circuit, wherein the other switch circuit is coupled between the voltage-to-current converter circuit and the current node.

9. The circuit of claim 1, wherein
the current-controlled oscillator circuit includes:
a current-controlled sawtooth ramp generator circuit; and
a current mirror that is arranged to receive an input current at the current node, and further arranged to provide a mirror current to the current-controlled sawtooth ramp generator circuit based on the input current.

10. The circuit of claim 9, wherein the current-controlled sawtooth ramp generator circuit includes:
a capacitor that is arranged to receive the mirrored current, and further arranged to provide a sawtooth ramp voltage;
a second comparator circuit that is arranged to compare the sawtooth ramp voltage with a ramp reference voltage, and to provide a current-controlled clock signal based on the comparison; and
a switch circuit that is arranged to at least partially discharge the capacitor if the current-controlled clock signal is asserted.

11. An integrated circuit for frequency setting and synchronization, comprising:
an input pin; and
an oscillator circuit that is arranged to provide an oscillator output signal such that:
if an input clock signal with sufficient drive is provided at the input pin, the frequency of the oscillator output signal is based on the frequency of the input clock signal; and
if a resistor is provided at the input pin, the frequency of the oscillator output signal is based on a resistance of the resistor.

12. The integrated circuit of claim 11, wherein the oscillator circuit is arranged to provide the oscillator output signal such that the oscillator output signal is one of an output clock signal and a sawtooth ramp signal.

13. The integrated circuit of claim 11, further comprising a pulse width modulation comparator that is arranged to compare the oscillator output signal with a modulating signal, wherein the oscillator circuit is arranged to provide the oscillator output signal such that the output signal is a sawtooth ramp signal.

14. The integrated circuit of claim 11, wherein the oscillator circuit includes:
a first comparator circuit including a first input, a second input that is coupled to the input pin, and an output;
a latch circuit including a first input that is coupled to the output of the comparator circuit, and an output;
a switch circuit that is coupled between the input pin and a current node, wherein the switch circuit includes a control input that is coupled to the output of the latch circuit; and
a current-controlled oscillator that is coupled to the current node.

15. The integrated circuit of claim 11, wherein the oscillator circuit includes:
a switch circuit that is coupled between the input pin and a current node, wherein the oscillator circuit is arranged to control the switch circuit such that the switch circuit is on if a clock signal with sufficient drive is provided at the input pin, and such that the switch circuit if off if a resistor is provided at the input pin.

16. The circuit of claim 15, further comprising a current-controlled oscillator that is coupled to the current node.

17. The integrated circuit of claim 15, wherein the oscillator circuit further includes:
a first comparator circuit including a first input, a second input that is coupled to the input pin, and an output, wherein the first comparator circuit is arranged to provide a synchronization signal at the output based on a comparison of a signal at the input pin and a reference voltage at the first input, and wherein the switch circuit is arranged to be opened and closed based, in part, on the synchronization signal.

18. The integrated circuit of claim 17, wherein the oscillator circuit further includes:
a latch circuit that is arranged to provide a switch control signal based, in part, on the synchronization signal, wherein the switch circuit is configured to open and close based on the switch control signal.

19. A method for frequency setting and synchronization, comprising:
receiving an input signal at an input pin; and
providing an oscillator output signal such that:
if the input signal is a clock signal with sufficient drive, a frequency of the oscillator output signal is based on a frequency of the input clock signal; and
if a resistor is provided at the input pin, the frequency of the oscillator output signal is based on a resistance of the resistor.

20. The method of claim 19, wherein providing the oscillator output signal includes:
    coupling the input pin to a current node;
    if a voltage at the input pin reaches a reference voltage:
        substantially de-coupling the input pin from the current node; and
        providing the oscillator output signal based on a frequency of the voltage at the input pin;
    providing, at the current node, another reference voltage that is less than the reference voltage; and
    if the voltage at the input pin is less than the reference voltage;
        providing a current associated with the input signal to the current node; and
        providing the oscillator output signal such that a frequency of the oscillator output signal is based on the current associated with the input signal.

\* \* \* \* \*